(12) United States Patent
Cronin

(10) Patent No.: US 9,407,253 B2
(45) Date of Patent: Aug. 2, 2016

(54) COMMUNICATION PROTOCOL

(71) Applicant: Amantys Ltd., Cambridge (GB)

(72) Inventor: Ivan Cronin, Cambridge (GB)

(73) Assignee: MASCHINENFABRIK REINHAUSEN GMBH, Regensburg (DE)

( * ) Notice: Subject to any disclaimer, the term of this patent is extended or adjusted under 35 U.S.C. 154(b) by 0 days.

(21) Appl. No.: 14/391,171

(22) PCT Filed: Mar. 8, 2013

(86) PCT No.: PCT/GB2013/050572
§ 371 (c)(1),
(2) Date: Oct. 8, 2014

(87) PCT Pub. No.: WO2013/156749
PCT Pub. Date: Oct. 24, 2013

(65) Prior Publication Data
US 2015/0097598 A1 Apr. 9, 2015

(30) Foreign Application Priority Data

Apr. 20, 2012 (GB) .................................. 1206921.7

(51) Int. Cl.
*H03K 3/00* (2006.01)
*H03K 17/18* (2006.01)
(Continued)

(52) U.S. Cl.
CPC ................ *H03K 17/18* (2013.01); *H02M 1/08* (2013.01); *H02M 7/537* (2013.01)

(58) Field of Classification Search
CPC ........ H03K 17/18; H02M 1/08; H02M 1/088; H02M 1/092; H02M 7/537
USPC ............. 326/82, 83, 87, 89, 91; 327/108–112
See application file for complete search history.

(56) References Cited

U.S. PATENT DOCUMENTS 5,990,724 A * 11/1999 Bijlenga ............... H02M 1/088
327/432
6,504,696 B1 * 1/2003 Mikosz ................... H02J 3/005
361/93.8
(Continued)

FOREIGN PATENT DOCUMENTS

DE          3826509 A1    6/1989
DE    102005016440 A1   10/2006
(Continued)

OTHER PUBLICATIONS

International Search Report and Written Opinion from corresponding International Application No. PCT/GB2013/050572, mailed on Aug. 5, 2013.
(Continued)

*Primary Examiner* — William Hernandez
(74) *Attorney, Agent, or Firm* — Andrew Wilford

(57) ABSTRACT

The application generally relates to apparatus for driving high voltage power switching devices such as IGBTs. An aspect provides a method of adding a sensing capability to a device driver for driving at least one high voltage power switching device of a power switching apparatus having device side circuitry comprising said at least one device and said driver and having control side circuitry comprising a driver controller, the device driver arranged to be coupled to a said driver controller by a communications link, the device driver arranged to drive said at least one device on or off in response to a switching signal received on said communications link from the driver controller, the device driver further arranged to transmit an acknowledge signal to said driver controller in response to said received switching signal, said acknowledge signal detectable at said driver controller as a valid said acknowledge signal, the method comprising: providing a sense circuit to output an indication of a condition of said device side circuitry; providing a modulation circuit to modulate a said acknowledge signal dependent on said condition indication prior to said transmission such that said modulated acknowledge signal is said acknowledge signal to be transmitted by said device driver to said driver controller in response to said received switching signal and detectable at said driver controller as a valid said acknowledge signal.

20 Claims, 6 Drawing Sheets

(51) Int. Cl.
*H02M 1/08* (2006.01)
*H02M 7/537* (2006.01)

(56) References Cited

U.S. PATENT DOCUMENTS

| | | |
|---|---|---|
| 2002/0167826 A1 | 11/2002 | Hochstuhl et al. |
| 2003/0210055 A1* | 11/2003 | Porter .................. G05B 9/02 324/415 |
| 2003/0218839 A1* | 11/2003 | Pfister .................. H02J 9/061 361/38 |
| 2004/0024937 A1 | 2/2004 | Duncan et al. |
| 2012/0013372 A1* | 1/2012 | Campbell ............. H03K 5/135 327/141 |
| 2012/0249020 A1* | 10/2012 | Komatsu .......... H03K 17/08128 318/139 |
| 2014/0346893 A1* | 11/2014 | Snook ................. H02M 1/088 307/115 |
| 2014/0368240 A1* | 12/2014 | Shelton ............. H03K 17/0822 327/109 |

FOREIGN PATENT DOCUMENTS

| | | |
|---|---|---|
| DE | 102005045957 A1 | 11/2006 |
| EP | 0418665 A1 | 9/1990 |
| WO | 9311610 A1 | 6/1993 |
| WO | 2007028014 A2 | 3/2007 |
| WO | 2011147055 A1 | 12/2011 |

OTHER PUBLICATIONS

Search Report from corresponding UK Application No. GB1206921.7, mailed on Aug. 17, 2012.
CT-Concept, "1SP0335V / 1SP0335 / 1SP0335D Description & Application Manual", 2011, available from: http://www.igbt-driver.com/fileadmin/Public/PDF/Products/ENG/SCALE-2/PnP/1SP0335/Manual/1SP0335_Manual.pdf.

* cited by examiner

COMMUNICATION PROTOCOL

CROSS REFERENCE TO RELATED APPLICATIONS

This application is the US-national stage of PCT application PCT/GB2013/050572 filed 8 Mar. 2013 and claiming the priority of British patent application 1206921.7 itself filed 20 Apr. 2012.

FIELD OF THE INVENTION

This invention generally relates to an apparatus for driving high-voltage power-switching devices such as IGBTs, and particularly to a method of adding a sensing capability to a device driver for driving at least one high-voltage power-switching device, a method of adding a monitoring capability to a driver controller for controlling a device driver to drive at least one high-voltage power-switching device, a method of adding sensing and monitoring capability to a power-switching apparatus comprising a driver controller and a device driver, a device driver for driving at least one high-voltage power-switching device, a driver controller for controlling a device driver to drive at least one high-voltage power-switching device, and a power-switching apparatus comprising at least one high-voltage power-switching device, more particularly to an inverter.

BACKGROUND TO THE INVENTION

Power semiconductor switching devices are widely in use for a large range of power applications. The power semiconductor switching devices with which we are concerned typically have a current-carrying capability of greater than 1 amp and are operable with a voltage of greater than 100 volts, for example devices that are able to carry currents of greater than 10 amps, 50 amps or 100 amps and/or are able to sustain a voltage difference across the device of greater than 500 volts or 1 KV.

Examples of such devices include insulated-gate bipolar transistors (IGBTs), as well as FETs such as MOSFETS (vertical or lateral) and JFETs, and potentially devices such as LILETs (lateral-inversion layer-emitter transistors), SCRs and the like. The techniques we will describe are not limited to any particular type of device architecture and thus the power-switching devices may be, for example, either vertical or lateral devices; they may be fabricated in a range of technologies including, but not limited to, silicon and silicon carbide.

Switching devices of this type have applications which include switching in high-voltage transmission lines, in particular dc transmission lines of the type which may, for example, carry power from an offshore wind installation, and medium voltage (for example greater than 1 KV) switching for motors and the like, for example locomotive motors. In particular, IGBTs are used to control large currents by the application of low-level voltages or currents, some IGBTs having ratings of, e.g., 1600V and 1200 A.

In applications of this type typically tens or hundreds of devices may be connected in series and/or parallel to operate at the desired voltages/currents. Controlling the switching of such devices presents particular problems, because the electrical environment is relatively noisy, operating conditions such as load currents and temperatures are continuously changing, and because the voltages/currents being switched are large, leading to a significant risk of device failure. Moreover when one device in such a system fails, other switching devices in the system can easily fail as a consequence.

Generally, systems for switching medium or high voltages are more easily constructed using multiple devices arranged in a series topology, in order to avoid use of higher power devices that are more costly and/or have slow switching speed. In an example inverter, IGBTs may be stacked and placed between power supply rails to form a phase leg as shown for example in FIG. 1a, which may represent a single leg inverter or a phase leg of a multiple leg inverter. FIG. 1b shows a multiple phase leg inverter having two IGBTs stacked in each of the upper and lower sides of each phase leg. The provision of a plurality of IGBTs in series allows the overall voltage, e.g., across an inverter phase leg or across IGBTs of a lower or upper side of an inverter phase leg, to be split across the IGBTs, allowing lower voltage IGBTs to be used and/or application of a higher overall voltage. Nevertheless, difficulties remain even when a series connection of IGBTs is used, for example in relation to reliability as indicated above.

OBJECTS OF THE INVENTION

In view of the above, there remains a need for improved monitoring and/or control of networks of power-switching devices, for example to allow, inter alia, failure prediction/avoidance, increased reliability, scalability (e.g., allowing a greater number of IGBTs to be connected in series), cost efficiency, power efficiency (i.e. low power dissipation, e.g., by reducing switching losses), and/or higher quality of output voltage and/or current waveforms.

More specifically, such improved monitoring and/or control may be desirable in view of manufacturing tolerances of devices from a given manufacturer and/or differences between power-switching devices from different manufacturers. Such devices may be combined in a network of power-switching devices, so that power-switching device operating characteristics may vary from device to device across the network of an apparatus such as an inverter. This may result in disadvantages as indicated above, for example low reliability due to poor voltage sharing among different series-connected power-switching devices, e.g., in one or more halves of a phase leg. Such poor sharing may occur for example due to differences in device turn-on and/or turn-off times. Thus, remote monitoring and/or control of individual device behavior may be advantageous.

It is desirable to overcome such difficulties, and/or others, most preferably in a manner that is compatible with existing power-switching device control products.

We will describe techniques which address these and other problems.

For use in understanding the present invention, the following disclosure is referred to:

1SP0335V/1SP0335S/1SP0335D Description and Application Manual (http://www.igbt-driver.com/fileadmin/Public/PDF/Products/ENG/SCALE-2/PnP/1SP0335/Manual/1SP0335 Manual.pdf.

SUMMARY OF THE INVENTION

According to a first aspect of the present invention, there is provided a method of adding a sensing capability to a device driver for driving at least one high-voltage power-switching device of a power-switching apparatus having device-side circuitry comprising the at least one device and the driver and having control side circuitry comprising a driver controller, the device driver arranged to be coupled to a the driver controller by a communications link, the device driver arranged to drive the at least one device on or off in response to a switching signal received on the communications link from the driver controller, the device driver further arranged to transmit an acknowledge signal to the driver controller in response to the received switching signal, the acknowledge signal detectable at the driver controller as a valid the acknowledge signal, the method comprising: providing a sense circuit to output an indication of a condition of the device-side circuitry; providing a modulation circuit to modulate a the acknowledge signal dependent on the condition indication prior to the transmission such that the modulated acknowledge signal is the acknowledge signal to be transmitted by the device driver to the driver controller in response to the received switching signal and detectable at the driver controller as a valid the acknowledge signal. For example, a the acknowledge signal detectable at the driver controller as valid may have a property such as duration, amplitude, frequency, etc. compliant with predefined minimum and/or maximum values, e.g., relating to duration and/or arrival time at the driver controller (such arrival time for example relative to a transmission time of an associated, preceding switching signal). Specifically, a minimum duration may be about (e.g., exactly or within +−1, 2, 5 or 10%) 0.6 µs and/or a maximum duration may be about 1.8 µs. More generally, the validity of the modulated signal may be determined by whether or not the modulated signal is recognizable by the driver controller as a valid acknowledge signal.

Thus, an existing device driver of a power-switching apparatus such as an inverter may be modified by fitting a sense circuit and a modulation circuit. Advantageously, the modified device driver may continue to communicate with the existing driver controller to provide existing functionality, in particular to provide to the driver controller an acknowledge signal recognizable by the driver controller as a response to a switching signal. Thus, a power-switching apparatus or device driver for such an apparatus may be retrofitted to add sensing capability, without requiring any further transmitter and/or communication link for communication of a sensed signal from the device driver to the driver controller. Preferably, data of a sensed device condition, e.g., temperature of the high-voltage switching device, is 'hidden' within an existing acknowledge signal by modulation.

There may further be provided the method, wherein the condition represents a status of the device-side circuitry, e.g., of the power-switching device, or a measured value of a parameter of the device-side circuitry, e.g., of the power-switching device, and the modulation comprises modulating one or more the acknowledge signals to encode the status or measured value into the one or more the acknowledge signals, the or each the acknowledge signal generated in response to a respective the switching signal. For example, each of a plurality of acknowledge signals may be modulated to represent a single bit of the value, and/or a single acknowledge signal may be modulated to represent a plurality of bits of the value. Such a the condition may represent whether a parameter, e.g., temperature, voltage and/or current, of the device is below a threshold, for example to indicate whether the power-switching device is operating within a safe operating limit of the device. For example, the exceeding of the threshold may be indicated by a longer duration of the acknowledge signal than for when the threshold is not exceeded.

The parameter may comprise: a temperature, voltage or current of the device; or a timing of an event such as a voltage or current peak of the device. More specifically, the parameter may comprise: power-switching device gate or gate-emitter voltage; power supply voltage; power-switching device collector-emitter saturation voltage; power-switching device collector or collector-emitter voltage; ambient temperature; or power-switching device switching time (e.g., for turn on or turn off, e.g. time for switching between about 10% and about 90% of the on state current). Thus, the method may allow communication of multi-bit data from the device driver to the driver controller, without requiring any additional transmitter and/or communication link for communication of a sensed signal from the device driver to the driver controller. Thus, it may be possible to monitor any one or more parameters of the high-voltage switching device to provide a comprehensive monitoring function without such additional communications means.

There may further be provided the method, wherein the modulation modulates each of a plurality of the acknowledge signals to represent a respective, single bit of a multi-bit value representing a the condition, to thereby transmit the multi-bit value from the device driver. Alternatively, two or more bits of the value comprising at least two bits may be encoded into any one or more of the acknowledge signals.

An example embodiment may output a packet of data having a preferably predefined structure, by encoding a plurality of acknowledge signals, for example wherein sub-sets of one or more of the successive acknowledge signals represent conditions indicated on the basis of respective analog-to-digital converters (ADCs). Optionally, such a packet may comprise control data such as for synchronisation, packet or data identification and/or error checking. In any case, transmitting of one or more condition indications from the device side, preferably by means of such a packet, may occur on an ad hoc basis, e.g., triggered by an event such as switch-on of the device side power supply, or may be continually repeated preferably without any external trigger.

There may further be provided the method, wherein the modulation modulates an acknowledge signal to represent a plurality of bits of a multi-bit value representing a the condition. For example, an acknowledge pulse may be modulated to provide a number of transitions and/or sub-pulses within a period defined by the minimum and maximum durations of a valid acknowledge pulse. Such a period may be referred to as a 'do not care' period, and may for example extend between 0.6 and 1.8 µs after the start of the acknowledge pulse.

There may further be provided the method, wherein the acknowledge signal comprises a pulse and the modulation adjusts a duration of the pulse signal such that the adjusted duration is between a minimum duration and a maximum duration of a valid the acknowledge pulse. In an embodiment, the minimum duration is about (e.g., exactly or within +−1, 2, 5 or 10%) 0.6 µs and/or the maximum duration is about 1.8 µs. For example, the modulation may adjust the duration to be about 0.8 µs to indicate a data bit (e.g., '1' or 'true') and/or to be about 1.6 µs to indicate an other data bit (e.g., '0' or 'false'). Thus, encoding a single bit of data into an acknowledge signal may be achieved. However, the method is extendible to allow more encoding of more than one binary data bit into a single valid acknowledge signal, for example an intermediate duration, e.g., 1.2 us, may indicate a value other than '0' or '1', e.g., a 2-bit binary value or a bit of an n-ary system where n>2.

There may further be provided the method, wherein the modulation comprises frequency modulation, amplitude modulation, and/or pulse width modulation, preferably wherein the modulation is for encoding of multi-level digital data. For example, each of three of more different defined frequencies, amplitudes and/or pulse widths may be used to represent respective data bits. Thus, the modulation of a single acknowledge signal may not be restricted to representing a single-bit binary value, i.e., '0'/'1' or 'true'/'false'.

According to a second aspect of the present invention, there is provided a method of adding a monitoring capability to a driver controller for controlling a device driver to drive at least one high-voltage power-switching device of a power-switching apparatus, the apparatus having device-side circuitry comprising the at least one device and the driver and having control side circuitry comprising the driver controller, the driver controller arranged to be coupled to a device driver by a communications link, the driver controller arranged to transmit a switching signal on a the communications link to control a the device driver to drive the at least one device on or off, the driver controller further arranged to receive an acknowledge signal from the communications link and to detect a valid the received acknowledge signal as a response to the switching signal, the method comprising: providing a demodulation circuit to demodulate a the detected valid acknowledge signal to thereby output a condition of the device-side circuitry, the condition encoded in the acknowledge signal. The condition may be as for the first aspect, for example a condition (e.g., status or measured value of a parameter) of the device.

Preferably, the driver controller is arranged to communicate with the above device driver, i.e., to send a switching signal to control the device driver to switch the device on/off and to recognize a valid acknowledge signal from the device driver. In this regard, the driver controller may have a duration discriminator for detecting when an acknowledge signal is valid. Preferably, the demodulation circuit uses this, or comprises another, duration discriminator to determine one or more data bits encoded into the acknowledge signal according to duration.

Advantageously, an existing driver controller of a power-switching apparatus such as an inverter may be modified by fitting a demodulation circuit, preferably such that the modified driver controller may continue to communicate with the existing device driver to provide existing functionality, in particular to provide to the device driver a switching signal and to receive and recognize a valid acknowledge signal from the device driver in response to the switching signal. Thus, a power-switching apparatus or driver controller for such an apparatus may be retrofitted to add monitoring capability, without requiring any further receiver and/or communication link for communication of a sensed signal from the device driver to the driver controller. Preferably, data of a sensed device condition, e.g., temperature of the high-voltage switching device, is 'hidden' within an existing acknowledge signal and detectable by demodulation at the driver controller.

There may further be provided a method of adding sensing and monitoring capability to a power-switching apparatus comprising a driver controller and a device driver, the device controller for driving at least one high-voltage switching device and the driver controller arranged to control the device driver to switch the device on and off, the method comprising the above method to add a sensing capability to the device driver and the above method to add a monitoring capability to the driver controller. In this way, each driver controller—device driver pair for driving an existing network of high-voltage switching devices of a power-switching apparatus such as an inverter may be updated to allow monitoring of all device, advantageously without requiring additional communications means adding size, cost and/or complexity.

According to a third aspect of the present invention, there is provided a device driver for driving at least one high-voltage power-switching device of a power-switching apparatus, the apparatus having device-side circuitry comprising the at least one device and the driver and having control side circuitry comprising a driver controller, the device driver arranged to be coupled to the driver controller by a communications link, the device driver arranged to drive the at least one device on or off in response to a switching signal received on the communications link from the driver controller, the device driver further arranged to transmit an acknowledge signal to the driver controller in response to the received switching signal, the acknowledge signal detectable at the driver controller as a valid the acknowledge signal, the device driver comprising: an input arranged to receive a condition indication of the device-side circuitry; and a modulator configured to modulate a the acknowledge signal dependent on the received condition indication, wherein the device driver is configured to transmit the modulated acknowledge signal as the acknowledge signal detectable at the driver controller as a valid the acknowledge signal.

Preferably, an existing device driver of a power-switching apparatus may be replaced by the above device driver with substantially no degradation of the existing functionality of the apparatus, in particular allowing the control of the device drivers to continue substantially as before the replacement. Furthermore, the device driver of an embodiment advantageously makes available data for monitoring of the high-voltage power-switching device(s), for use by compatible circuitry such as the driver controller below, such availability preferably provided with minimum modification of existing circuitry, e.g., without requiring any further communications link.

According to a fourth aspect of the present invention, there is provided a driver controller for controlling a device driver to drive at least one high-voltage power-switching device of a power-switching apparatus, the apparatus having device-side circuitry comprising the at least one device and the driver and having control side circuitry comprising the driver controller, the driver controller arranged to be coupled by a communications link to a the device driver, the driver controller arranged to transmit on the communications link a switching signal to control the device driver to drive the at least one device on or off, the driver controller arranged to receive an acknowledge signal on the communications link from the device driver and to detect a valid the received acknowledge signal, the driver controller comprising: a demodulator configured to demodulate the received acknowledge signal to thereby determine data encoded in the acknowledge signal; and an output configured to provide an indication of a condition of a the device-side circuitry on the basis of the determined data. Preferably, driver controller is for controlling a device driver that is an embodiment as described above.

Similarly as described above in relation to the device driver, an existing driver controller of a power-switching apparatus may be replaced by the above driver controller, preferably with substantially no degradation of the existing functionality of the apparatus, in particular allowing the control of the device driver(s) to continue substantially as before the replacement. Furthermore, the driver controller of an embodiment advantageously detects monitoring data encoded in an acknowledge signal, for monitoring of the high-voltage power-switching device(s), monitoring of the device(s) thus being achievable preferably provided with minimum modification of existing circuitry, e.g., without requiring any further communications link.

There may further be provided a power-switching apparatus having device-side circuitry comprising at least one high-voltage power-switching device and the above device driver configured to drive the at least one high-voltage power-switching device, and control side circuitry comprising the above driver controller configured to control the device driver to switch the at least one high-voltage power-switching device on and off. The control side circuitry and device-side circuitry may be located at opposite ends of a communications link for isolation and may be powered by respective power supplies; thus the at least one device and associated device driver(s) may be powered by a power supply separate from that of the driver controller. Such a power-switching apparatus may be for example an inverter, preferably comprising multiple phase legs and/or multiple high-voltage power-switching devices in each half of the/each phase leg. The inverter may for example be for use in an electric vehicle, for locomotive traction or marine drives, for an industrial motor drive, a wind turbine or solar inverter, a data center uninterruptible power supply or for high-voltage DC infrastructure for an electricity grid.

There may further be provided the power-switching apparatus, wherein the power-switching device comprises an IGBT or a FET such as a JFET or a MOSFET, and wherein the device driver is arranged to drive a gate of the IGBT or FET.

In a further aspect the invention provides a method of communicating configuration/measurement data in a power semiconductor switching device control system, the power semiconductor switching device control system comprising a coordinating control system and a plurality of switching device controllers, each coupled to the coordinating control system and each configured to one or more respective power semiconductor switching devices; the method comprising: sending control data comprising data for controlling switching to one or more of the switching device controllers; receiving an acknowledgment signal at the coordinating control system, wherein the acknowledgment signal comprises a pulse having leading and trailing edges, and wherein a timing interval between the leading and trailing edges has a permitted variation within which the acknowledgment signal is a valid signal; the method further comprising: encoding the configuration/measurement data into the acknowledgment signal within a timing window defined by the permitted variation such that the acknowledgment signal is an encoded acknowledgment signal; sending the encoded acknowledgment signal from a the switching device controller to the coordinating control system; and decoding the configuration/measurement data from the encoded acknowledgment signal at the coordinating control system; wherein the configuration/measurement data comprises data relating to a configuration of, or measurement on, the switching device controller or the power semiconductor switching device respectively.

In some preferred embodiments the encoding comprises changing the timing interval to encode the configuration/measurement data within a permitted variation of a duration of the acknowledgment pulse for the acknowledgment signal to be valid.

The invention also provides a method of retrofitting a configuration/measurement capability to an existing power semiconductor switching device control system, using this technique to encode configuration/measurement data within a timing tolerance of a valid acknowledgment signal within the system.

Preferred embodiments are defined in the appended dependent claims.

Any one or more of the above aspects, with or without any combination of one or more of the above optional features of the preferred embodiments, may be combined in any permutation.

BRIEF DESCRIPTION OF THE DRAWINGS

For a better understanding of the invention and to show how the same may be carried into effect, reference will now be made, by way of example, to the accompanying drawings, in which:

FIGS. 2a and 2b show, respectively: control circuitry blocks within a power-switching apparatus such as an inverter; such an apparatus may have one or more power-switching devices in each phase leg half of one or more phase legs, and each device driver 2 may be coupled to a respective driver controller 1 and/or a plurality of device drivers 2 may be coupled to a driver controller 1 in common; and an alternative arrangement to FIG. 2a;

DETAILED DESCRIPTION OF PREFERRED EMBODIMENTS

Figure 1A:
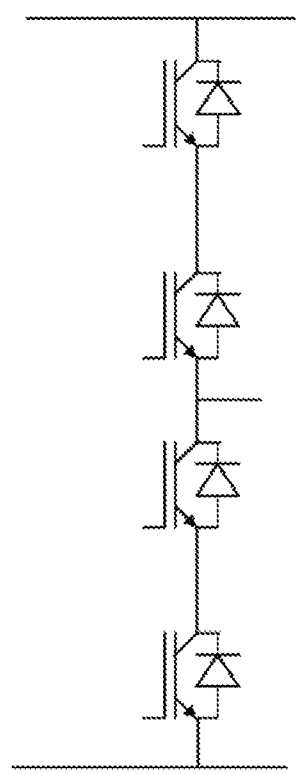
FIGS. 1a and 1b show: (a) a single leg of an inverter (an inverter may have one or more such legs, each half of the leg having one or more power-switching devices, e.g., one or more IGBTs); and (b) an example multiple phase leg inverter comprising a network of power-switching devices.
Figure 1B:
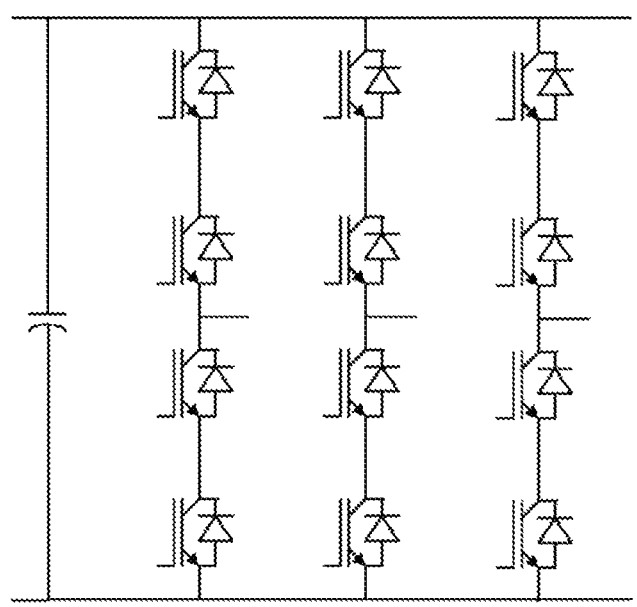
Figure 2A:
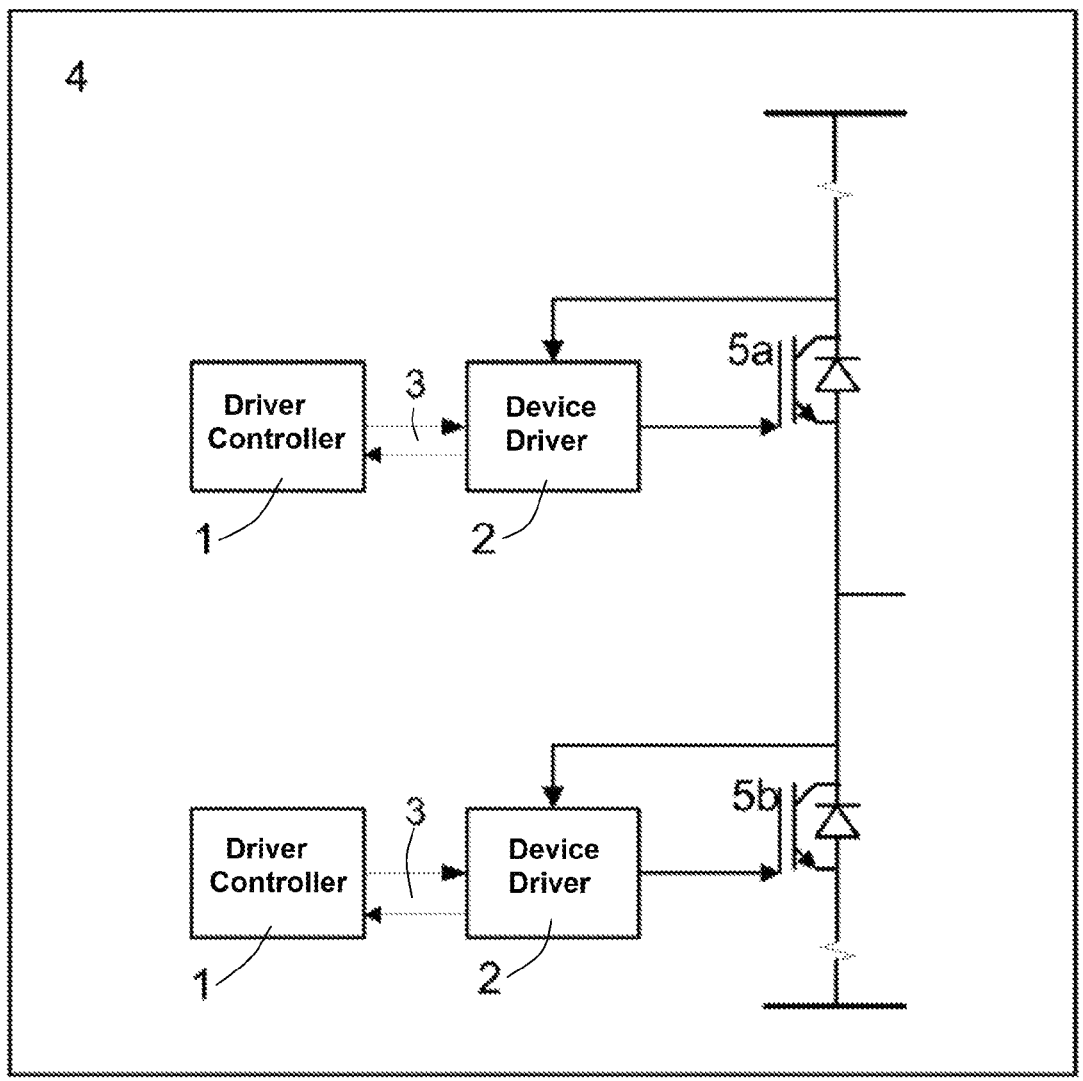

FIG. 2a shows an embodiment of a power-switching apparatus 4, e.g., an inverter, which comprises on the device side one or more power-switching devices 5a, 5b coupled to be controlled by respective device drivers in the form of gate drivers 2. The device drivers are coupled to be controlled by at least one driver controller on the control side, for example gate driver controller 1.

The power-switching devices 5a, 5b of FIG. 2a are shown as IGBTs, however may additionally or alternatively comprise one or more FETs (e.g., MOSFETS or JFETs), LILETs, SCRs, etc. Each such device 5a, 5b is shown as having an optional freewheel diode connected in parallel, for protection of the switching device against reverse voltages and currents.

Coupling between each device driver and its corresponding driver controller preferably provides voltage isolation for example by means of transformer- or opto-coupling. Thus, each bi-directional link 3 of FIG. 2a may comprise optical fiber (e.g., an optical fiber for communication in both directions, or a respective such fiber for each direction) or a transformer.

As the skilled person will recognize, circuitry not shown in FIG. 2a may be present, in particular one or more power-switching devices may be present in either or both of the lines to the supply rails (e.g., VSS and 0V)—these lines are interrupted in FIG. 2 to indicate this.

Figure 2B:
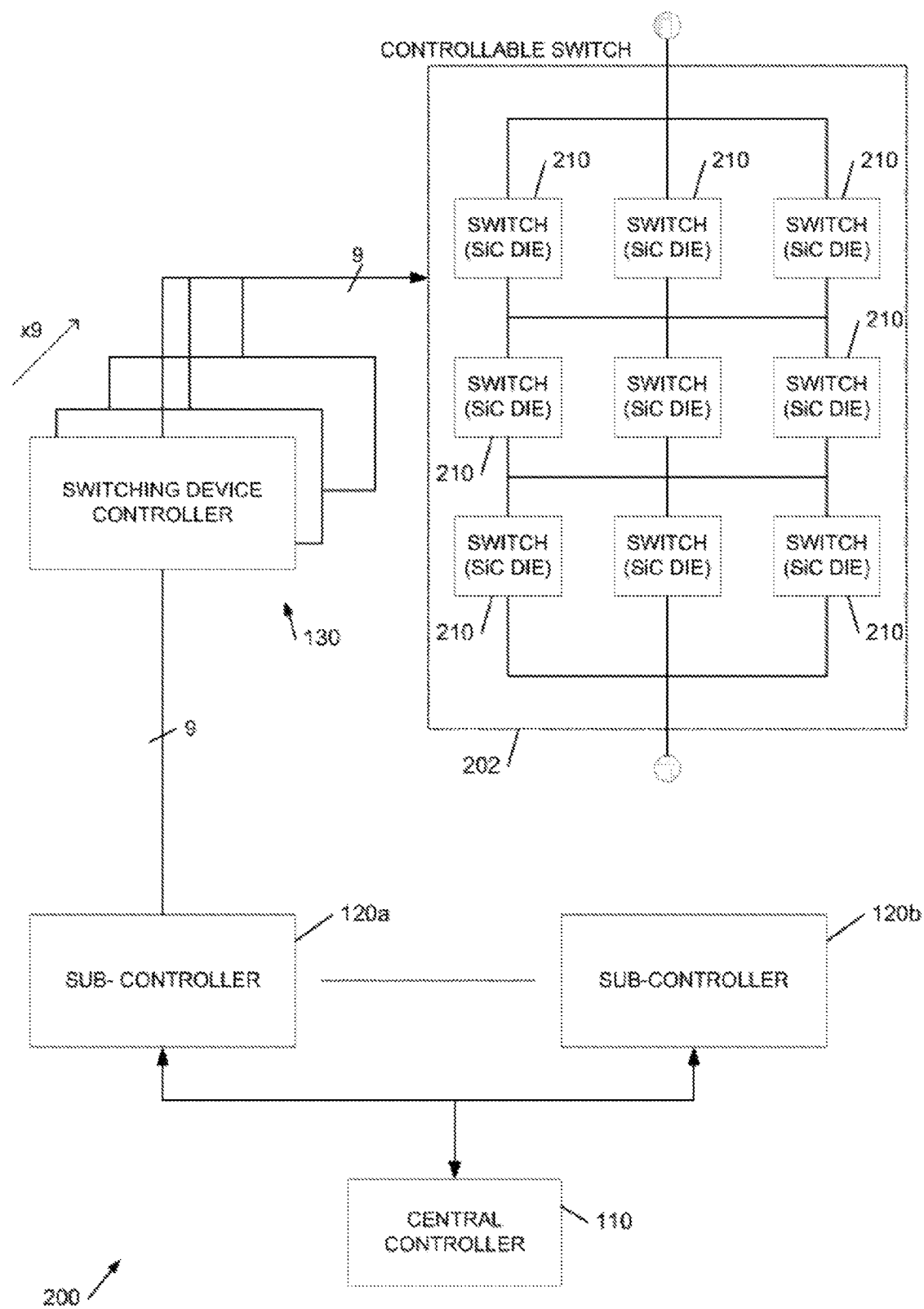

The expanded diagram of FIG. 2b shows a similar, but larger scale system in which a single controllable switch 202 comprises nine power semiconductor switching devices 210, for example each comprising a silicon carbide die, multiple devices being connected in parallel to create a voltage level, sets of multiple devices then being connected in series to series-connect the voltage levels. In other arrangements a single switching device controller may control two or more switches or device dies. Each switch 210 has a respective switching device controller 130 which, in turn, is coupled to one of the sub-controllers 120a, b. As illustrated a separate bus runs between a sub-controller and a switching device controller so that there is one such bus for each switching device controller, but this is merely by way of example. In a high-voltage and/or current power electrical circuit with multiple switches hundreds or potentially thousands of semiconductor switching devices may be employed connected in series and/or parallel and the switching device controllers system control the switching of these devices so that they switch in synchronism, in effect substantially simultaneously. It would be advantageous to reduce the communications overhead of carrying configuration/measurement data in such a system. It would also be useful to be able to retrofit an existing system with such capabilities where they are not present, or present in only a limited form.

For example it is desirable to have a mechanism for the central controller to receive high-level fault information from the switching device controllers, preferably with as short a delay as practicable—this may be used to detect fault conditions in order to take corrective action. We will describe, inter alia, a mechanism for the central controller to interrogate the switching device controllers (SDs) and sub-controllers (SCs) for fault diagnosis, initial device configuration, and to read measurement data for fault prognosis and the like, preferably with as small as possible overall communications latency.

The returned measurement data may comprise, by way of example only: current or voltage data; rate of change of current or voltage data; temperature data; or any other desired/relevant data. The result may be employed by the coordinating control system, for example, to determine what action to take which may, in this situation, include one or more of action to reduce a temperature of some or all of the switching devices, and action to reduce or remove a voltage from some or all of the switching devices, for example by switching off another portion of the circuit (semi-)permanently. Potentially an address or other identifier of the sending device may be included, although in some preferred embodiments of the protocol we describe below just one or a few bits of data are encoded within the acknowledgment protocol. Example configuration/control data which may be returned is data defining that a switching device/node is in a sleep mode, shutdown mode or the like.

Figure 3:
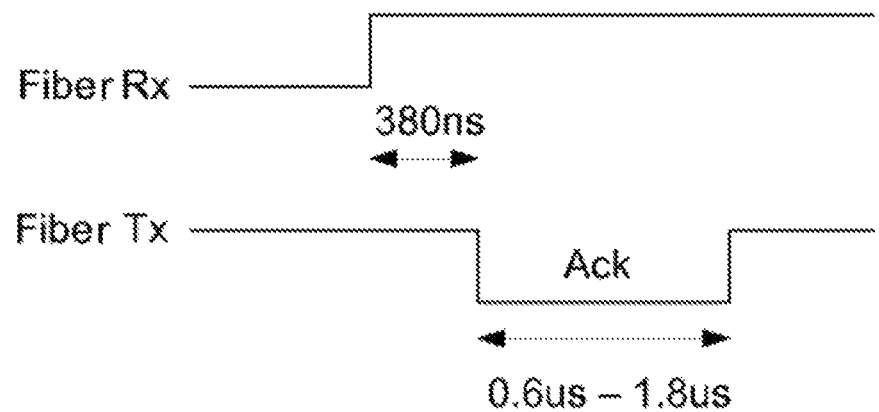
FIG. 3 shows optical signaling, wherein a power-switching device is turned on using light on a Fiber Rx line and an acknowledgment of the turn-on signal is then transmitted as a 'no light' pulse on a Fiber Tx line.

FIG. 3 shows a first signaling protocol operable in such an embodiment. A driving signal, e.g., a switching signal representing data to instruct on/off switching of an IGBT, is transmitted by the gate driver controller 1 to the gate driver 2. For example, in normal operation, light may be ON on the Fiber Rx line at all times when the IGBT is intended to be conducting, and otherwise OFF. In response to the driving signal, an acknowledge ('ack') signal is transmitted from the gate driver 2 to the gate driver controller 1 by means of the link 3. Such an acknowledge signal may be transmitted in response to detection at the gate driver of each driving signal, e.g., detection of each switching edge (transition) of the driving signal.

The actual duration, e.g., 700 ns or 1 us, of the acknowledge signal (preferably a pulse) as received at the gate driver controller may depend on delays in receiver and/or transmitter circuitry coupled to the link 3, e.g., due to capacitance associated with any RC time constant of such circuitry. However, generally the gate driver controller will recognize an acknowledge signal as valid only where the received signal complies with certain requirements, e.g., has duration within minimum (e.g., 0.6 μs) and maximum (e.g., 1.8 μs) lengths and/or arriving within a predefined time period after transmission of the driving signal, e.g., a fixed time (e.g., about 380 ns) after the transmission and/or a within a period defined by minimum and/or maximum times relative to the transmission.

Thus, an IGBT may be turned on by switching on of light on a Fiber Rx line and acknowledged by a pulse on a Fiber Tx line. Each on-off or off-on transition of the fiber light is acknowledged with a short acknowledge pulse of no light, which occurs typically 380 ns after the transition on the Fiber Rx line. A valid acknowledge pulse to be returned to the controller may have a minimum duration of 0.6 μs and a maximum duration of 1.8 μs.

Figure 4:
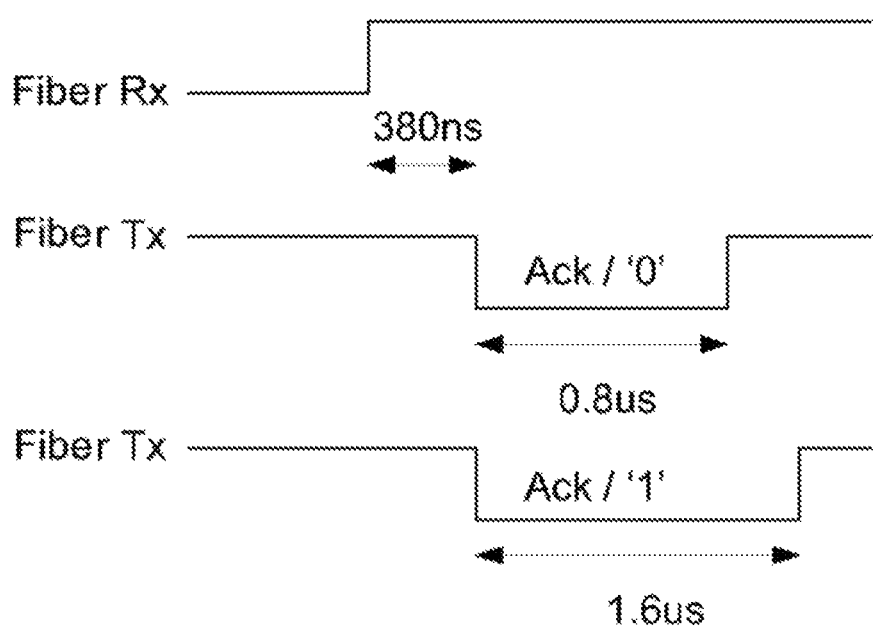
FIG. 4 shows optical signaling in an embodiment, wherein a power-switching device is turned on as in FIG. 3 but duration of the acknowledge pulse on the Fiber Tx line is 0.8 microseconds (us) to indicate a data '0' or 1.6 microseconds to indicate a data '1'.

A further signal that may be transmitted from the gate driver to the gate driver controller, for example on the Fiber Tx line of FIG. 3 or 4, may be a fault signal. Such a signal may for example indicate short circuit of a power-switching device.

Typically, the fault signal is a pulse of no light and is distinguished from the acknowledge signal by having longer duration than the acknowledge signal. For example, where the duration of a valid acknowledge pulse is within 0.6-1.8 μs, the fault signal may be required to have duration of any length greater than 1.8 μs.

The detection of a valid acknowledge signal at the gate driver controller may generally be taken as indicating at least that the bidirectional link 3 is operational in both directions and that the driving signal has been received at the gate driver. If an acknowledge signal is not detected as expected subsequent to transmission of the driving signal, this may indicate that at least one directional channel of the fiber-optic link 3 is not operating properly, e.g., a fiber has become disconnected and/or broken, and/or associated electro-optic receiver and/or transmitter circuitry has failed.

An embodiment implements a communication protocol as in FIG. 3, modified however to transmit an indication of a condition of the power-switching device, e.g., gate drive monitoring data, using a modulated acknowledge signal, e.g., as shown in FIG. 4. Such an embodiment may be implemented in the structure as shown in FIG. 2. The embodiment may be configured to be operable according to such a modified protocol and/or according to FIG. 3. In the modified protocol of FIG. 4, the condition indication may be encoded into an acknowledge pulse by changing the timing, e.g., varying width, of the pulse on the transmit fiber for the gate driver, this allowing transmission of a data bit on the acknowledge pulse. For example, the acknowledge pulse of FIG. 3 may be encoded to provide one bit of data per switching edge. Example timings are shown in FIG. 4 as being an 800 ns acknowledge pulse to indicate a data '1' and a 1600 ns acknowledge pulse to indicate a data '0' to send monitoring data back.

More specifically, using PWM, a specific timing of an end transition of the acknowledge signal occurring after the minimum duration of a valid such pulse, for example within a "do not care" region of the pulse such as 1.6-1.8 us after the start of the acknowledge pulse, may indicate a data bit. Alternatively, multiple on/off transitions may be provided in such a pulse/region to provide one or more additional, relatively short, pulses, each of these short pulses alone or in combination indicating data bit(s).

Advantageously, operation of a gate driver controller 1 of a system configured to operate according to FIG. 3 is substantially unaffected when the controller is coupled to a substitute gate driver 2 configured to operate according to FIG. 4. Similarly, operation of a gate driver 2 of a system configured to operate according to FIG. 3 may be substantially unaffected when coupled to a substitute gate driver controller 1 configured to operate according to FIG. 4. Moreover, an existing power-switching apparatus may be retro-fitted with a gate driver controller 1 and/or a gate driver 2 of an embodiment and continue to function substantially as before.

The data encoded within the acknowledge signal may be a one-bit indication relating to a status of the power-switching device, e.g., representing on/off, '1'/'0' or 'true'/'false' depending on the status being monitored. For example, the status indication may concern whether parameter(s) such as temperature, voltage across (e.g. Vce) and/or current through (e.g. Ic) the power-switching device is/are within preprogrammed limit(s) preferably corresponding to device ratings as provided in a device datasheet. A one-bit data transmission would generally suffice to provide such a status indication.

Additionally or alternatively, data encoded within the acknowledge signal(s) may represent a measured value of a parameter of the power-switching device, for example a temperature, voltage (e.g. collector voltage Vc or collector-emitter voltage Vce) or current (e.g. collector current Ic) of the device, or timing of an event, e.g., an absolute or relative time, or duration, for example of switching (turn-on or turn-off) of the device or of a peak in such a voltage or current.

The measured parameter may be an indication that allows estimation or calculation of a parameter such as supply current or supply voltage of the apparatus comprising the power-switching device. For example, the total supply voltage may be estimated as a multiple of a transmitted measured value of the voltage across a power-switching device, depending on the configuration of the network of power-switching devices.

Advantageously, parameters such as the full supply voltage may thus be monitored without requiring any additional communications components, e.g., extra optical fiber and/or electro-optic receiver and/or transmitter for communication between the gate driver and gate driver controller. The provision of any such additional circuitry is generally difficult, since circuit design may require voltage isolation to take into account high voltages that may be present at the power-switching apparatus.

One or more parameters of the device's gate driver, e.g., temperature, fault condition, programmable resistor value, reference voltage of a driver's feedback control relative to the device voltage to be controlled (e.g. device collector voltage), etc., may be monitored similarly.

Advantage may taken of the acknowledge signal being a response to a switching signal. For example, the turn on/off of the device may be used as a sampling window for sampling device side parameters; where turn on/off occurs regularly, such sampling may occur at an average rate of, e.g., 1 kHz. In this regard, the sampling of a parameter may occur substantially at the time of turn-on (off), preferably when the device has been off (on) for a relatively long duration. Thus the power-switching device current may be substantially stable so that low noise, i.e., low EMI, conditions may be present at the time of measurement. Nevertheless, it is to be noted that where some form of memory is provided, a parameter may be measured and corresponding measurement data transmitted in acknowledge signal(s) at a later time.

The monitoring of the status or of such parameters as described above may be carried out at the driver controller—or at a central control facility coupled to receive condition indication(s) from one or more driver controllers—for example as a warning of likely failure of the power-switching device and/or driver. Appropriate preventative action, such as replacement of a module or device, may then be taken.

Data encoded in the one or more acknowledge signals may represent one or more of the following six primary parameters:

power-switching device gate voltage Vg, or gate-emitter voltage Vge;

positive secondary supply voltage V+, e.g., the voltage of the isolated power supply on the gate drive side of the communications link;

power-switching device collector-emitter saturation voltage Vcesat;

power-switching device collector voltage or collector-emitter voltage Vce;

ambient temperature at the power-switching device and/or gate driver; and/or power-switching device switching time (time from command ON (e.g. from detection of the switching signal at the gate driver) to Vce saturation).

From one or more of these primary parameters, one or more of the following secondary parameters of the power-switching device may be calculated or inferred, for example at the gate driver controller or at a central control facility coupled thereto:

Device Vge Plateau Voltage

Device gate charge (e.g., the charge that must be supplied to the gate, either to swing the gate by a given amount, or to achieve full switching. An indication of a significant change of this charge, e.g., by 5%, 10% or 20%, may indicate device wear-out; such a change may be detected by monitoring for example a (preferably constant) gate current and/or time of supplying such gate current, to change the gate voltage by a predetermined amount or to achieve full switching, e.g. to within about 10% of the final current).

Driver supply current (e.g., how much current the device driver, e.g., gate drive, consumes—since a proportion of this current is used to switch the device, over time this current may be used give an indication of the charge supplied to the device and advantageously correlate with gate charge; thus the condition indication of an embodiment may indicate gate drive supply current and the control side may monitor the indications for changes, e.g., a change of 5%, 10% or 20% may taken as indicating device wear-out).

Device collector over-voltage (at turn-off of the device (e.g. IGBT), the voltage measured at the collector (Vice) may overshoot due to stray inductance in the circuit; this overshoot may damage the device if it is not kept within certain limits. The device driver preferably employs a circuit to limit this value. In an embodiment wherein a transmitted condition indication encodes the Vice value, the indication may be monitored at the control side to check whether the limiting circuit is functioning, or if no such circuit is fitted, that the device is being driven within its specification).

Device (e.g. IGBT) temperature

Device collector current Ic

Device dVce/dt

As indicated above, an embodiment may transmit a single bit of information in each acknowledge signal. Thus, a value requiring more than one bit may be represented by a series of preferably consecutive acknowledge signals. In this regard, monitoring data, may be sampled by an analog-to-digital converter (ADC). A microcontroller may assemble a packet of data and then serialize this data to apply it to a programmable logic device, e.g., complex programmable logic device (CPLD), PAL or FPGA, that drives the fiber output altering the width appropriately when it is a '0' or a '1'. The embodiment block diagram of FIG. 5 may be suitable for transmitting values in this manner.

Figure 5:
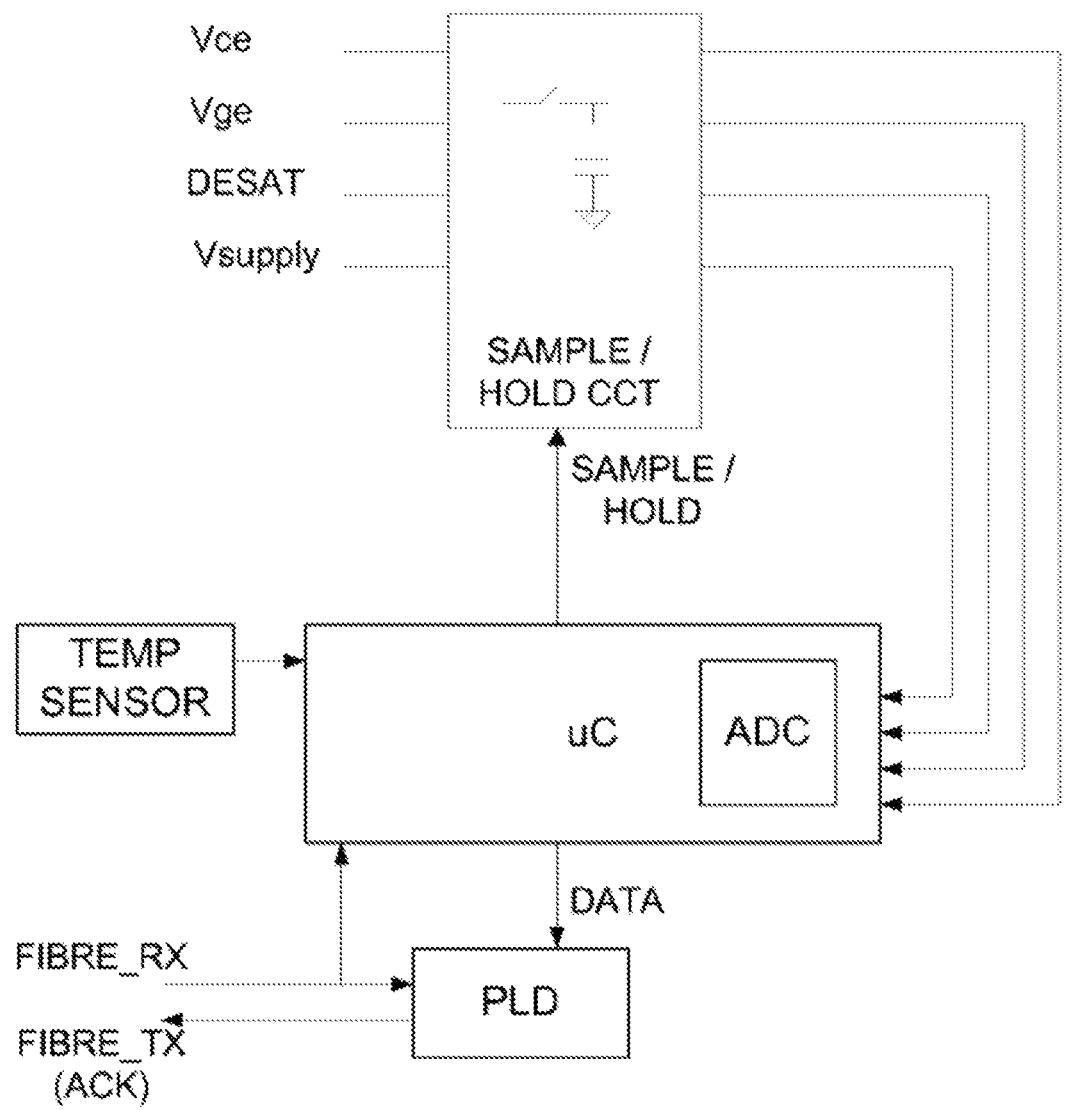
FIG. 5 shows a block diagram of circuitry in/at the gate driver for performing an embodiment.
Figure 6:
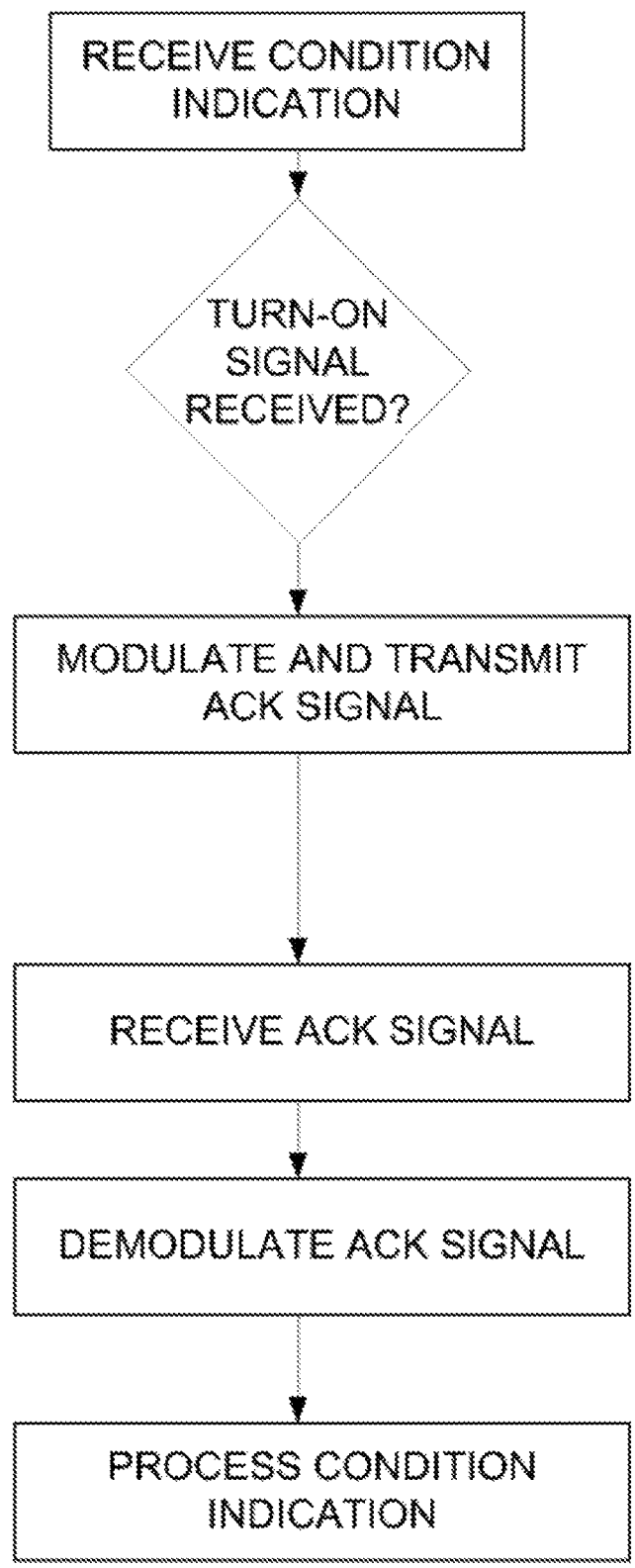
FIG. 6 shows a flow diagram of a method embodiment involving modulation at the device side and demodulation at the control side.

FIG. 5 shows a microcontroller (uC) at the gate driver side of the link 3, preferably a main/sole microcontroller of the gate driver 2. The uC comprises an analog to digital converter (ADC) for converting analog signals as sampled by the sample/hold circuitry and subsequently inputted to the microcontroller. (Alternatively, the ADC may be external to the microcontroller). Timing of sampling one or more of the analog signal(s) may be controlled by the microcontroller by means of the input to the sample/hold circuitry. A temperature value may be provided directly as a digital value from the temperature sensor ('TEMP SENSOR'), or may be sampled and/or converted similarly as the above analog signals. Resulting digital data is provided from the uC to circuitry, preferably implemented in a programmable logic device (PLD), for output to the gate driver controller over the communications link, e.g., on the Fiber_TX line. The PLD is preferably configured to modulate one or more acknowledge signals as described above, according to the digital data from the microcontroller.

Thus, the micro-controller (uC) may perform the following:
1. Sample voltage(s) and/or temperature(s) using ADC(s)
2. Calculate checksum
3. Write header, values and checksum to a shift register
4. Shift out bits one per acknowledge signal, i.e., one per edge of the switching signal
5. Go to 1.

The format of the data to as shifted out on the acknowledge signals, e.g., one 64-bit packet, is for example:
[16-bit] Header
[16-bit] Count
[16-bit] Temperature
[16-bit] ADC0
[16-bit] ADC1
[16-bit] ADC2
[16-bit] ADC3
[16-bit] Checksum,
wherein the ADC channels 0-3 may be used to communicate one or more measured conditions such as the voltages below:
ADC0: Vge Gate voltage
ADC1: Vdd Positive supply (secondary output from isolated PSU on gate drive side of communications link)
ADC2: Vcesat Saturation voltage (Vce <50V measured at some time when the IGBT is ON)
ADC3: Vce Collector voltage (measured when the device is OFF)

Preferably, the header enables the receiver to synchronize to the data. The count may increment, so that packets can be identified. ADC0-3 are the analogue to digital channels corresponding to measured parameters, e.g., voltages. The checksum preferably enables data to be determined as invalid data in the event of corruption and/or mis-synchronisation of the receiver.

It is however possible to extend this protocol to write any amount of information gathered on the gate drive.

Variations may further be made to the above embodiment to allow one or multiple bits per acknowledge signal to be encoded by means of any one or more of various types of modulation of the acknowledge pulse, e.g., amplitude modulation (AM; e.g., multi-level (2, 3 or more levels) digital data encoding), frequency modulation (FM), pulse width modulation (PWM), etc. As the skilled person may appreciate, for frequency modulation, the embodiment may be configured to change the light wavelength according to the data; thus such an embodiment may comprise a transmitter at the device driver side for wavelength conversion, and a receiver at the control side to recover data from the wavelength converted signal. On the other hand, an embodiment implementing amplitude modulation may require a receiver which could discriminate different levels of light falling on it.

In view of the above description, an advantage of some embodiments is to allow a parameter to be measured remotely across an existing optical link, i.e., without any additional communications link, e.g., any extra optical fiber. Moreover, a gate driver of an embodiment, which is configured for transmitting an encoded acknowledge pulse, may be compatible with conventional operation of an existing gate driver controller. Similarly, a gate driver controller for of embodiment, which is configured for receiving and responding to an encoded acknowledge pulse, may be compatible with conventional operation of an existing gate driver. Thus, elements of an embodiment are advantageously backward compatible with existing drive circuitry.

Furthermore, embodiments may allow monitoring data to be exported from the drive without an existing system controller 'knowing' whether or not it is controlling a gate drive operating the communication protocol. In this case, the timing change of the acknowledge pulse for the data encoding is preferably within constraints, e.g., minimum and/or maximum duration, associated with recognition of the acknowledge pulse as a valid acknowledge pulse. Thus, an existing system controller may provide gate drive control without requiring any modification, i.e., there is preferably no effect on the conventional operation of an existing gate driver controller.

Specific advantages of embodiments include: 1) to allow more complicated diagnostic functions while existing gate drive control continues to function correctly; and/or 2) to allow gate drive users to be selective as to which gate drive(s) they swap out to have the present communication protocol functionality in an existing configuration comprising multiple power devices.

The invention further provides processor control code to implement the above-described system and control procedures, for example on an embedded processor. The code may be provided on a carrier such as a disk, CD- or DVD-ROM, programmed memory such as read-only memory (Firmware), or on a data carrier such as an optical or electrical signal carrier. Code (and/or data) to implement embodiments of the invention may comprise source, object or executable code in a conventional programming language (interpreted or compiled) such as C, or assembly code, code for setting up or controlling an ASIC (Application Specific Integrated Circuit) or FPGA (Field Programmable Gate Array), or code for a hardware description language such as Verilog (Trade Mark) or VHDL (Very high speed integrated circuit Hardware Description Language). As the skilled person will appreciate such code and/or data may be distributed between a plurality of coupled components in communication with one another.

No doubt many other effective alternatives will occur to the skilled person. For example, although we have described encoding configuration/measurement data within a timing tolerance of a valid acknowledgment signal, aspects of the invention contemplate other approaches in which, for example, configuration/measurement data is encoded within the tolerance of some other parameter of a signal, preferably but not necessarily an acknowledgment signal, returned from a switching device controller to a coordinating system controller. For example an amplitude tolerance or frequency tolerance of a returned signal may be employed to encode returned data from a switching device controller to a coordinating system controller. The skilled person will also appreciate that it is particularly advantageous that embodiments of a method we describe retrofit a capability to encode returned data in a parameter of a signal, such as an acknowledgment signal, returned from a switching device controller to a coordinating system controller, utilizing a tolerance within the signal, in particular in a system in which operation is normally well within the permitted tolerance variation. In still further embodiments, a permitted encoding technique (timing values and/or number of bits and the like) may be learnt during operation of the system.

It will be understood that the invention is not limited to the described embodiments and encompasses modifications apparent to those skilled in the art lying within the spirit and scope of the claims appended hereto.

The invention claimed is:

1. A method of adding a sensing capability to a device driver for driving a high-voltage power-switching device of a power switching apparatus having device-side circuitry comprising the power-switching device and the device driver and having control-side circuitry comprising a driver controller, the device driver arranged to be coupled to the driver controller by a communications link, the device driver arranged to drive the power-switching device on or off in response to a switching signal received on said communications link from the driver controller, the device driver further arranged to transmit an acknowledge signal to the driver controller in response to the, said acknowledge signal being detectable at the driver controller as valid, the method comprising:
    outputting with a sense circuit an indication of a condition of said device-side circuitry; and
    modulating with a modulation circuit the acknowledge signal dependent on said condition indication prior to said transmission and to transmit the modulated acknowledge signal by said device driver to the driver controller in response to the received switching signal and detectable at the driver controller as valid.

2. The method of claim 1, wherein the acknowledge signal detectable at the driver controller as valid has a duration compliant with predefined minimum and/or maximum values.

3. The method of claim 1, wherein said condition represents a status of the device-side circuitry or a measured value of a parameter of the device-side circuitry, and
    said modulation comprises modulating the acknowledge signal to encode said status or measured value into the acknowledge signal, the acknowledge signal being generated in response to a respective said switching signal.

4. The method of claim 3, wherein said status represents whether a parameter of the device-side circuitry is below a threshold to indicate whether the power-switching device is operating within a safe operating limit of said power-switching device.

5. The method of claim 3, wherein said parameter comprises:
    a temperature, voltage or current of said power-switching device; or
    a timing of a peak voltage or peak current of the power-switching device.

6. The method of claim 3, wherein said parameter comprises:
    a power-switching device gate or gate-emitter voltage;
    a power supply voltage of said device-side circuitry;
    a power-switching device collector-emitter saturation voltage;
    a power-switching device collector or collector-emitter voltage;
    an ambient temperature of said device-side circuitry; or
    a power-switching device switching time.

7. The method of claim 1, wherein the modulation modulates each of a plurality of said acknowledge signals to represent a bit of a multi-bit value representing the condition, to thereby transmit said multi-bit value from the device driver.

8. The method of claim 1, wherein said modulation modulates the acknowledge signal to represent a plurality of bits of a multi-bit value representing the condition.

9. The method of claim 1, wherein said acknowledge signal comprises a pulse and said modulation adjusts a duration of said pulse signal dependent on said condition such that the adjusted duration is between a minimum duration and a maximum duration of a valid said acknowledge pulse.

10. The method of claim 9, wherein said minimum duration of said valid acknowledge pulse is about 0.6 µs and said maximum duration of said valid acknowledge pulse is about 1.8 µs.

11. The method of claim 9, wherein said modulation adjusts said duration to be about 0.8 µs to indicate a data bit and to be about 1.6 µs to indicate another data bit.

12. The method of claim 1, wherein said modulation comprises frequency modulation, amplitude modulation, and/or pulse width modulation, and said modulation is for encoding of multi-level digital data.

13. A method of adding a monitoring capability to a driver controller for controlling a device driver to drive a high-voltage power-switching device of a power switching apparatus, the apparatus having device-side circuitry comprising the power-switching device and the device driver and having control-side circuitry comprising the driver controller, the driver controller arranged to be coupled to the device driver by a communications link, the driver controller arranged to transmit a switching signal on the communications link to control the device driver to drive the power-switching device on or off, the driver controller further arranged to receive an acknowledge signal from said communications link and to detect a valid said received acknowledge signal as a response to said switching signal, the method comprising:
    providing a demodulation circuit to demodulate the detected valid acknowledge signal to thereby output a condition of said device-side circuitry, said condition encoded in said acknowledge signal.

14. A device driver for driving a high-voltage power-switching device of a power switching apparatus, the apparatus having device-side circuitry comprising the power-switching device and the device driver and having control-side circuitry comprising a driver controller, the device driver arranged to be coupled to the driver controller by a communications link, the device driver arranged to drive the power-switching device on or off in response to a switching signal received on said communications link from the driver controller, the device driver further arranged to transmit an acknowledge signal to the driver controller in response to the received switching signal, said acknowledge signal detectable at the driver controller as valid, the device driver comprising:
    an input arranged to receive a condition indication of said device-side circuitry; and
    a modulator configured to modulate the acknowledge signal dependent on said received condition indication, wherein the device driver is configured to transmit said modulated acknowledge signal as said acknowledge signal detectable at the driver controller as valid.

15. A driver controller for controlling a device driver to drive a high-voltage power-switching device of a power switching apparatus, the apparatus having device-side circuitry comprising the power-switching device and the device driver and having control-side circuitry comprising the driver controller, the driver controller arranged to be coupled by a communications link to the device driver, the driver controller arranged to transmit on said communications link a switching signal to control said device driver to drive the power-switching device on or off, the driver controller arranged to receive an acknowledge signal on said communications link from said device driver and to detect a valid said received acknowledge signal, the driver controller comprising:
- a demodulator configured to demodulate said received acknowledge signal to thereby determine data encoded in said acknowledge signal; and
- an output configured to provide an indication of a condition of the device-side circuitry on the basis of said determined data.

16. The power switching apparatus of claim 15, wherein the apparatus comprises an inverter.

17. The power switching apparatus of claim 15, wherein said power-switching device comprises an IGBT or an FET such as a JFET or a MOSFET, and wherein said device driver is arranged to drive a gate of said IGBT or FET.

18. A method of communicating configuration/measurement data in a power semiconductor switching device control system, said power semiconductor switching device control system comprising a coordinating control system and a plurality of switching device controllers, each coupled to said coordinating control system and each configured to control one or more respective power semiconductor switching devices; the method comprising:
- sending control data comprising data for controlling switching to one or more of said switching device controllers;
- receiving an acknowledgment signal at said coordinating control system, wherein said acknowledgment signal comprises a pulse having leading and trailing edges, and wherein a timing interval between said leading and trailing edges has a permitted variation within which said acknowledgment signal is a valid signal; the method further comprising:
- encoding said configuration/measurement data into said acknowledgment signal within a timing window defined by said permitted variation such that said acknowledgment signal is an encoded acknowledgment signal;
- sending said encoded acknowledgment signal from the switching device controller to said coordinating control system; and
- decoding said configuration/measurement data from said encoded acknowledgment signal at said coordinating control system;
- wherein said configuration/measurement data comprises data relating to a configuration of, or measurement on, said switching device controller or said power semiconductor switching device respectively.

19. A method as claimed in claim 18 wherein said encoding comprises changing said timing interval to encode said configuration/measurement data within a permitted variation of a duration of said pulse for said acknowledgment signal to be valid.

20. A method of retrofitting a configuration/measurement capability to an existing power semiconductor switching device control system, said power semiconductor switching device control system comprising a coordinating control system and a plurality of switching device controllers, each coupled to said coordinating control system and each configured to control one or more respective power semiconductor switching devices; the method comprising:
- using the method of claim 18 to encode said configuration/measurement data within a permitted variation of a duration of said pulse for said acknowledgment signal to be valid within said existing power semiconductor switching device control system.

* * * * *